United States Patent
Aikawa

[19]

[11] Patent Number: 6,166,964
[45] Date of Patent: Dec. 26, 2000

[54] SEMICONDUCTOR MEMORY AND METHOD OF CONTROLLING DATA THEREFROM

[75] Inventor: Tadao Aikawa, Kawasaki, Japan

[73] Assignee: Fujitsu Limited, Kawasaki, Japan

[21] Appl. No.: 09/288,573

[22] Filed: Apr. 9, 1999

[30] Foreign Application Priority Data

Sep. 22, 1998 [JP] Japan .................................. 10-268321

[51] Int. Cl.[7] .................................................. G11C 7/00
[52] U.S. Cl. ........................................ 365/189.05; 365/63
[58] Field of Search ............................... 365/189.05, 63, 365/230.08

[56] References Cited

U.S. PATENT DOCUMENTS 5,764,562  6/1998  Hamamoto ................................ 365/63
5,847,985  12/1998  Mitani et al. ............................. 365/63
6,084,817  7/2000  Toda ........................................ 365/63

*Primary Examiner*—Son T. Dinh
*Attorney, Agent, or Firm*—Arent Fox Kintner Plotkin & Kahn, PLLC

[57] ABSTRACT

A semiconductor memory, such as a multibit DRAM, has a multiple cell array banks, each having multiple cell arrays. Rows of sense amplifiers are located near each of the cell arrays and extend in a first direction. Multiple rows of transfer switches, also extending in the first direction, are located adjacent to each of the cell array banks. A first data bus, which extends in a second direction which is perpendicular to the first direction, connects the sense amplifiers with the transfer switches. Multiple data buffer rows extend in the first direction near the transfer switches. A second data bus, extending in the first direction, connects the transfer switches with the data buffers. A layout pitch is defined by a spacing between adjacent lines of the first data bus. The transfer switches are placed in accordance with the defined layout pitch and the data buffers are placed according to a layout pitch determined by multiplying the defined layout pitch by the number of cell array banks.

20 Claims, 5 Drawing Sheets

SEMICONDUCTOR MEMORY AND METHOD OF CONTROLLING DATA THEREFROM

BACKGROUND OF THE INVENTION

The invention relates to a semiconductor memory, and more particularly, to a multi-bit data DRAM cell array.

Referring to FIG. 1, a conventional dynamic random access memory (DRAM) 100 employs a hierarchical data bus (GDB, MDB) structure. The DRAM 100 comprises a plurality of column decoders 1, a plurality of cell arrays 2, and a plurality of column select lines CL extending from the column decoders 1 over the cell arrays 2. Each column decoder 1 is connected to a corresponding cell column select line CL. Each cell array 2 includes a plurality of memory cells, not shown. The cell arrays 2 are connected to sense-amp rows 3 each of which includes a plurality of sense-amps 4. The sense-amp rows 3 are connected to data buffers 5 via data buses GDB which extend parallel to the column select lines CL. The data buffers 5 are in turn connected to a main data bus MDB which extends in a direction orthogonal to the data buses GDB.

When a memory cell is selected by the column select line CL, a corresponding sense-amp 4 in the sense-amp row 3 amplifies data from the selected memory cell and provides it to the data bus GDB. Data on the data bus GDB is fed to the main data bus MDB via the data buffer 5.

A sense-amp pitch P or its layout pitch is defined in terms of the breadth occupied by a pair of adjacent sense-amps 4. In this instance, the layout pitch P is substantially equal to a spacing between two adjacent column select lines CL. On the other hand, the column decoder 1 has a breadth equal to the layout pitch P. When the column decoders 1 comprise a simple circuit with a reduced number of elements, it is possible to locate or place the column decoders 1 well within the constraint of the layout pitch P.

When it is desired to deliver multi-bit data to a peripheral circuit rapidly, the column decoders 1 are replaced by data buffers 5, as shown for the DRAM 110 in FIG. 2. Also, the column select lines CL are replaced by data buses GDB extending over the cell arrays-2. The number of sense-amps 4 connected to each data bus GDB is generally either two or four for each row 3 (two being shown in FIG. 2). The layout pitch P is defined by a spacing between two adjacent data buses GDB which is substantially equal to the breadth occupied by a pair of adjacent sense-amps 4. In this instance, it is necessary that the breadth for each data buffer 5 be defined by the layout pitch P.

However, it is noted that the data buffer 5 represents a differential amplifier circuit designed to detect and amplify a minimal potential. Because of the increased complexity of the circuit design for the data buffer 5 in comparison to the column decoder 1 shown in FIG. 1, it is difficult to establish the breadth of the data buffer 5 according to the layout pitch P. If an attempt is made to force the breadth of the data buffer 5 into conformity with the defined layout pitch P, a symmetry in the circuit of the data buffer 5 is lost, leading to inaccuracy of data detection. One solution would be to increase the number of sense-amps 4 connected to a single data buffer 5, thus effectively increasing the layout pitch P. However, an increased number of sense-amps 4 connected to each data buffer 5 results in an increase in the load on the data buffer 5, which is undesirable.

It is an object of the invention to provide a semiconductor memory and a method of controlling data therefrom which facilitate the layout of data buffers.

SUMMARY OF THE INVENTION

To achieve the above objective, the present invention provides a semiconductor memory comprising: a plurality of cell arrays each including a plurality of memory cells; a plurality of data buses connected to the memory cells disposed in an area of the plurality of cell arrays; a plurality of transfer switches connected to the plurality of data buses; and a plurality of data buffers connected in common to the plurality of transfer switches, wherein the plurality of transfer switches are controlled so that when a specific one of the cell arrays is activated, the plurality of data buses in the specific one of the cell arrays are connected with the plurality of data buffers.

The present invention further provides a method of controlling a semiconductor memory including a plurality of cell arrays each including a plurality of memory cells, a plurality of data buses connected to the memory cells disposed in an area of the plurality of cell arrays, a plurality of transfer switches connected to the plurality of data buses, and a plurality of data buffers connected in common to the plurality of transfer switches, the method comprising the steps of: activating a specific one of the cell arrays; deactivating the remaining cell arrays; turning on the transfer switches associated with the activated the cell array to connect the plurality of data buses with the plurality of data buffers; and turning off the plurality of transfer switches which correspond to the remaining cell arrays to disconnect the plurality of data buses from the plurality of data buffers.

The present invention provides a semiconductor memory, comprising: a plurality of cell arrays, each including a plurality of memory cells; a plurality of sense amplifier rows extending in a first direction in an area of the plurality of cell arrays, each of the sense amplifier rows including a plurality of sense amplifiers; a plurality of transfer switch rows extending in the first direction adjacent to each of the cell arrays, each of the plurality of transfer switch rows including a plurality of transfer switches; a plurality of first data bus lines connecting the sense amplifiers with the transfer switches, wherein the first data bus lines extend in a second direction which is substantially perpendicular to the first direction, each data bus line connecting one sense amplifier in each sense amplifier row to one of the transfer switches; a plurality of data buffer rows extending in the first direction, each data buffer row including a plurality of data buffers; and a plurality of second data bus lines extending in the first direction and connecting the plurality of transfer switches with the data buffers.

The present invention further provides a semiconductor memory comprising: a first and a second memory block, each including memory cells; a first group of data buses for transmitting a data from the memory cells in the first memory block; a second group of data buses for transmitting a data from the memory cells in the second memory block; a first group of transfer switches, each connected to corresponding one of the first group of data buses; a second group of transfer switches, each connected to corresponding one of the second group of data buses; a plurality of data buffers, each coupled to both of corresponding one of the first group of transfer switches and one of the second group of transfer switches; wherein the first and second groups of transfer switches, which receive a control signal, are controlled such that when one of the first and second groups of transfer switches turns on, another of the first and second groups of transfer switches turns off, in response to the control signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
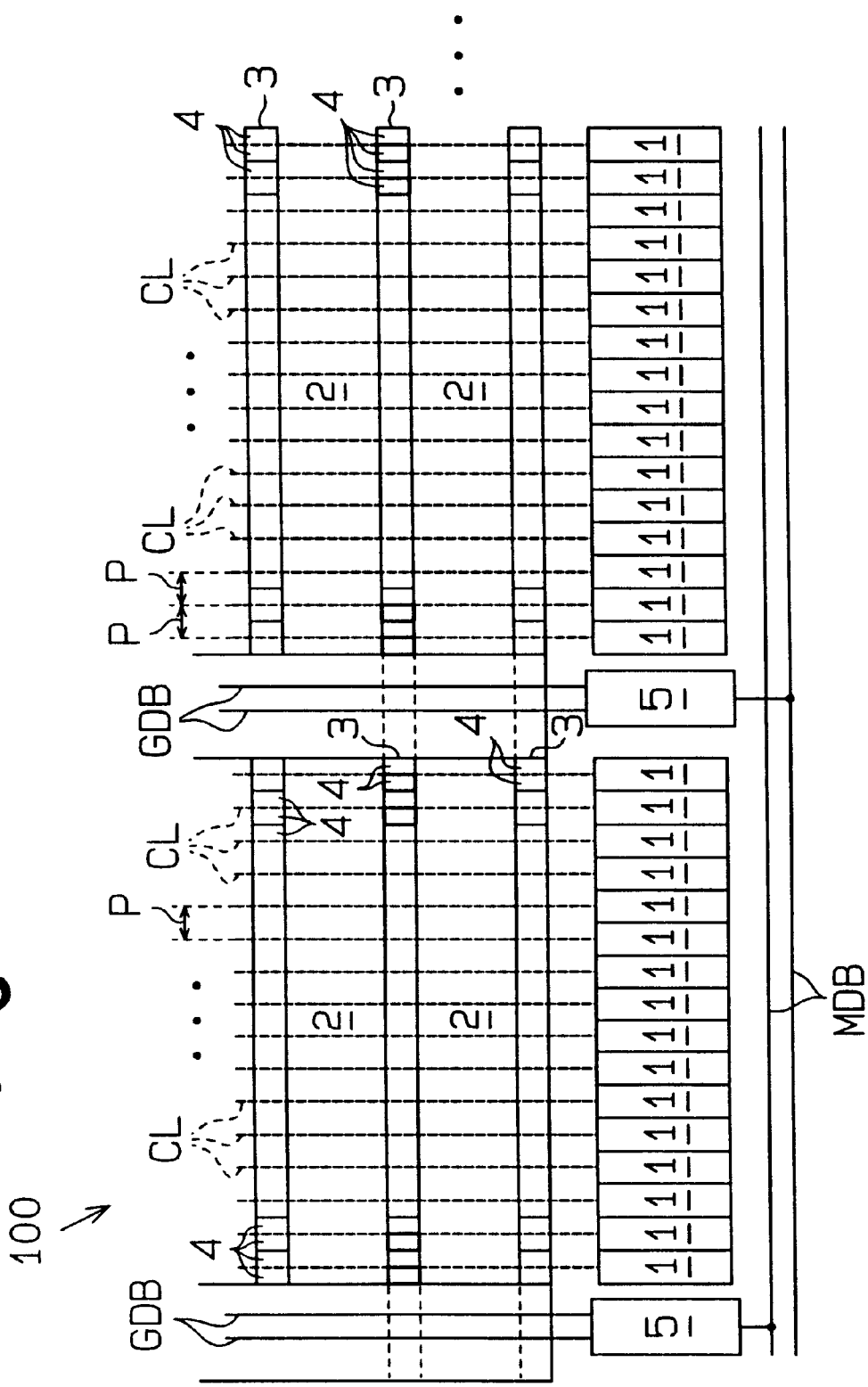
FIG. 1 is a schematic diagram of a cell array structure of a conventional DRAM.
Figure 2:
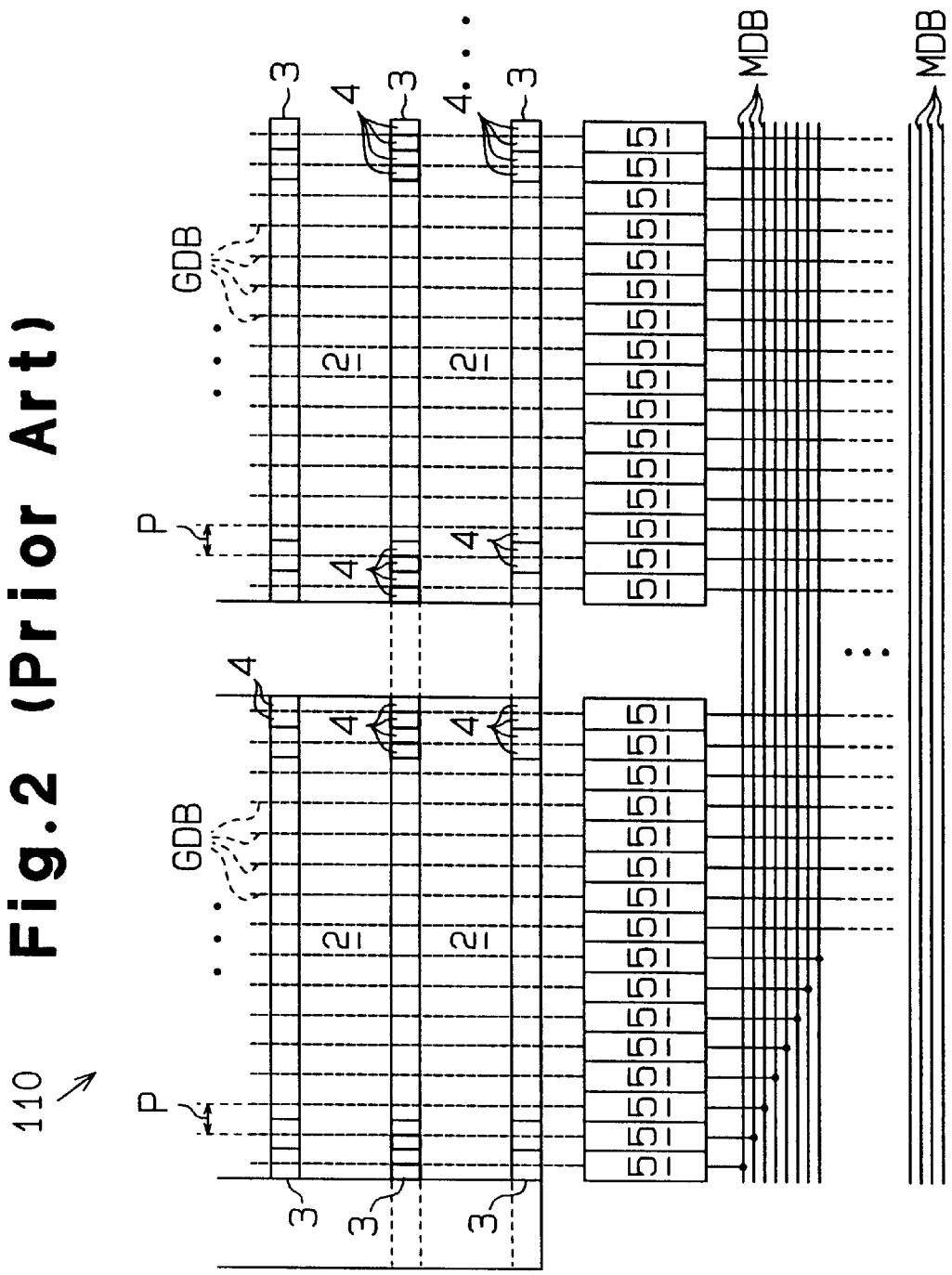
FIG. 2 is a schematic diagram of a cell array structure of a conventional multi-bit output type DRAM.
Figure 3:
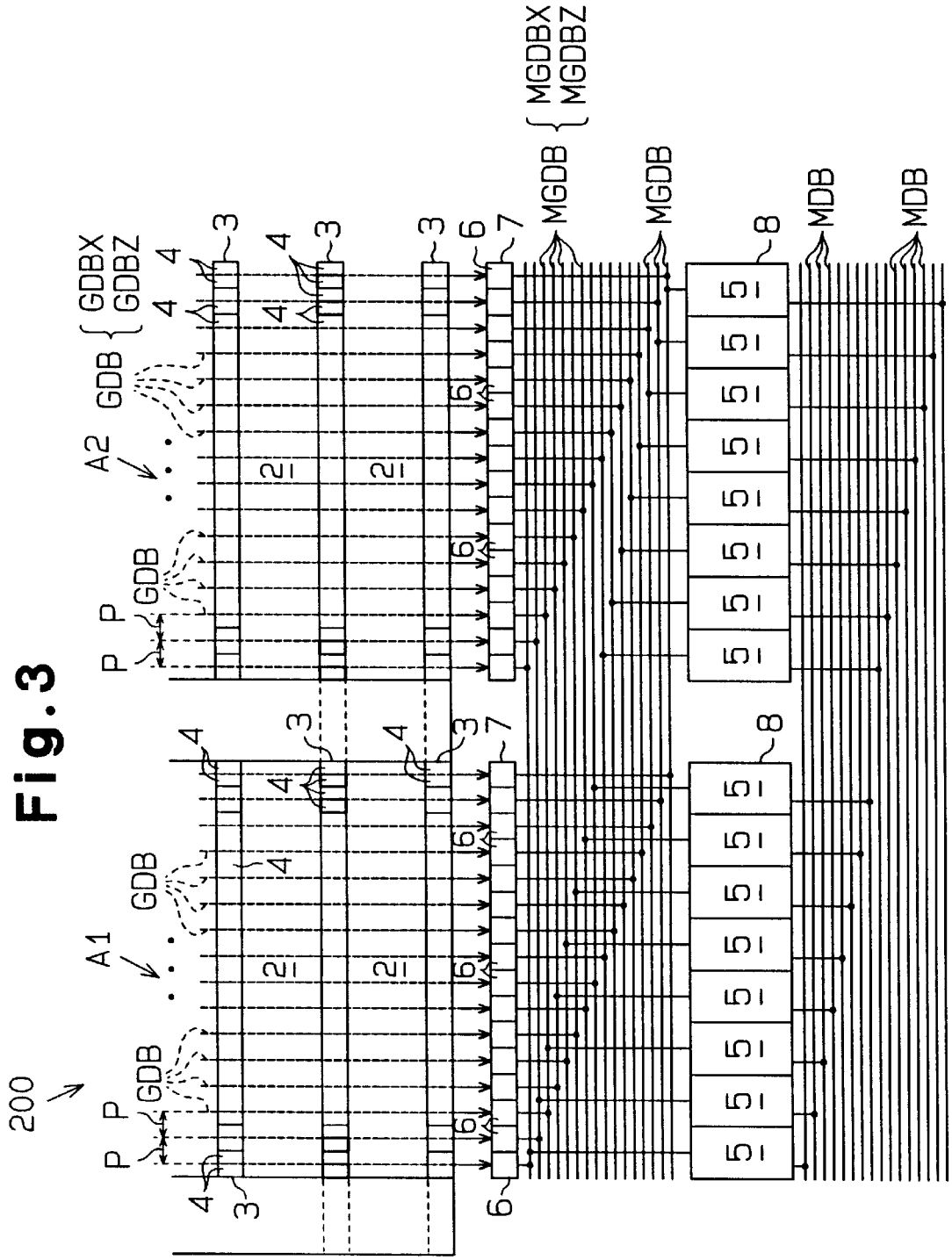
FIG. 3 is a schematic diagram of a cell array structure of a DRAM according to one embodiment of the present invention.
Figure 4:
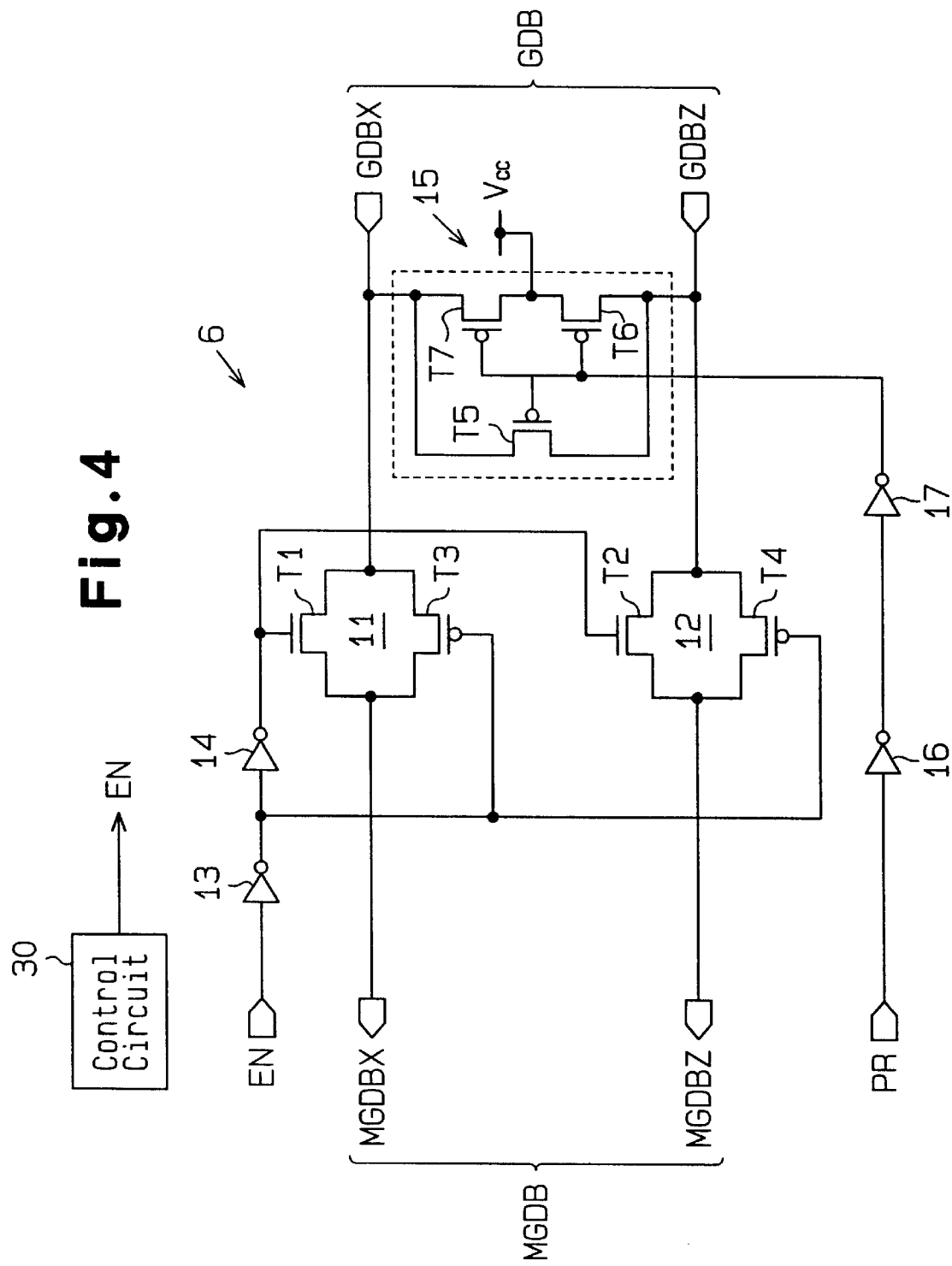
FIG. 4 is a circuit diagram of a transfer switch of the DRAM of FIG. 3.

Referring to FIGS. 3 and 4, a high rate multi-bit output type DRAM 200 according to one embodiment of the present invention will now be described. As shown in FIG. 3, the DRAM 200 comprises first and second cell array banks A1, A2, and data buffer rows 8 connected to the cell array banks A1, A2 via transfer switch rows 7.

Each of the first and second cell array banks A1, A2 includes a plurality of cell arrays 2 which are preferably disposed one above another as viewed in FIG. 3. Each cell array 2 preferably has an equal number of cells. Sense-amp rows 3 including a plurality of sense-amps 4 are disposed between adjacent cell arrays 2. The first and second cell array banks A1, A2 form a pair. When one of the cell arrays 2 is activated, the remaining cell arrays 2 are deactivated.

The transfer switch rows 7 are disposed parallel to the sense-amp rows 3. Each transfer switch row 7 includes a plurality of transfer switches 6. In the present example, each transfer switch row 7 includes sixteen transfer switches 6. Each row of data buffers 8 includes a plurality of data buffers 5. In the present example, each row of data buffers 8 includes eight of the data buffers 5. The data buffer rows 8 are disposed parallel to the transfer switch rows 7.

A plurality of data buses GDB are located within the first and second cell array banks A1, A2 and extend a direction orthogonal to the sense-amp rows 3. The number of data buses GDB in the first cell array bank A1 is equal to the number of data buses GDB in the second cell array bank A2. The data buses GDB connect the sense-amps 4 with the transfer switches 6.

A plurality of intermediate data buses MGDB are disposed between the transfer switch rows 7 and the data buffer rows 8 and extend parallel with the transfer switch rows 7. Each of the intermediate data buses MGDB is connected to corresponding ones of the data buffers 5 and the transfer switches 7. The number of intermediate data buses MGDB is equal to the number of data buses GDB in the first cell array bank A1 or the number of data buses GDB in the second cell array bank A2.

A plurality of main data buses MDB are shown at the bottom of FIG. 3 which are parallel with the intermediate data buses MGDB. Each of the main data buses MDB is connected to an associated one of the data buffers 5. The number of main data buses MDB is equal to the number of data buses GDB. The main data buses MDB are connected to individual data buffers 5 in the pair of data buffer rows 8.

Although for the convenience of illustration, each data bus GDB is shown by a single line in FIG. 3, it should be understood that it preferably comprises a pair of buses including data buses GDBX and GDBZ conveying complementary signals. Also, each intermediate data bus MGDB, which is shown by a single line, preferably comprises a bus pair including intermediate data buses GDBX and GDBZ conveying complementary signals. In contrast, each of the main data buses MDB preferably comprises only a single line.

The layout pitch P is defined by a spacing between the data buses GDB, or more exactly, by a spacing between adjacent data buses GDBX. Each of the data buses GDB is substantially connected with a pair of sense-amps 4 in a single sense-amp row 3. It will be appreciated that the layout pitch P is substantially the same as the breadth of a pair of sense-amps 4.

Each of the data buses GDB is connected to a corresponding transfer switch 6. It will be noted that the transfer switches 6 are disposed along the sense-amp rows 3 at a spacing of the layout pitch P on one side of the first and second cell array banks A1, A2. Each of the transfer switches 6 selectively connects one of the intermediate data buses MGDB and one of the data buses GDB.

The left-most transfer switch 6 associated with each of the first and second cell array banks A1, A2 is preferably connected to the intermediate data bus MGDB which is disposed closest to the transfer switch rows 7. The remaining transfer switches 6 which are disposed to the right of the left-most transfer switch 6 are successively connected to the intermediate data buses MGDB which are sequentially removed from the transfer switch rows 7, as shown in FIG. 3. In this manner, a transfer switch 6 in the first cell array bank A1 and the corresponding transfer switch 6 in the second cell array bank A2 are connected to a common intermediate data bus MGDB.

Each data buffer 5 amplifies data read onto one of the intermediate data buses MGDB via an associated transfer switch 6, thus delivering the amplified data to one of the main data buses MDB. Because of the drive capability required, the data buffers 5 are disposed at a pitch which is about twice the layout pitch P. In other words, the data buffer 5 has a breadth which is twice the breadth of the transfer switch 6. Accordingly, the number of the data buffers 5 in the first cell array bank A1 is equal to one-half the number of transfer switches 6 therein. Similarly, the number of the data buffers 5 in the second cell array bank A2 is equal to one-half the number of transfer switches 6 therein. Thus, the total number of the data buffers 5 is equal to the number of the transfer switches 6 contained in either the first or the second cell array bank A1, A2.

The eight data buffers 5 associated with the first cell array bank A1 are connected to the eight intermediate data buses MGDB located close to the transfer switch row 7. Specifically, the left-most data buffer 5 for the first cell array bank A1 is connected to the intermediate data bus MGDB which is located closest to the transfer switch row 7, and the data buffers 5 which are disposed to the right of the left-most data buffer 5 are successively connected to the intermediate data buses MGDB which are sequentially further removed from the transfer switch row 7.

On the other hand, the eight data buffers 5 associated with the second cell array bank A2 are connected to the eight intermediate data buses MGDB which are located further from the transfer switch row 7. Specifically, the right-most data buffer 5 for the second cell array bank A2 is connected to the intermediate data bus MGDB which is most removed from the transfer switch row 7, and the data buffers 5 which are disposed to the left of the right-most data buffer 5 are successively connected to the intermediate data buses MGDB which are sequentially closer to the transfer switch row 7.

Stated differently, the left-most data buffer 5 is connected to the pair of left-most transfer switches 6 for the first and second cell array banks A1, A2 via the intermediate data bus MGDB. The second left-most data buffer 5 associated with the first cell array bank A1 is connected to the pair of second left-most transfer switches 6 for the first and second cell array banks A1, A2 via the intermediate data bus MGDB. The remaining data buffers 5 are similarly connected to pairs of transfer switches contained in the first and second cell array banks A1, A2 through corresponding intermediate data buses MGDB. This means that each data buffer 5 is shared by a pair of the transfer switches 6.

Referring now to FIG. 4, the transfer switch 6 will be described. The transfer switch 6 comprises first and second transfer gate circuits 11, 12 and a precharge drive circuit 15 connected to both of the circuits 11, 12. The DRAM 200 additionally comprises a control circuit 30 for generating a switch enable signal EN used to turn the transfer switch 6 on and off.

The first transfer gate circuit 11 is connected to the data bus GDBX and the intermediate data bus MGDBX and the second transfer gate circuit 12 is connected to the data bus GDBZ and the intermediate data bus MGDBZ. The first transfer gate circuit 11 comprises an N-channel MOS transistor T1 and a P-channel MOS transistor T3. The second transfer gate circuit 12 comprises an N-channel MOS transistor T2 and a P-channel MOS transistor T4. Each of the N-channel MOS transistors T1, T2 has a gate which receives the switch enable signal EN from the control circuit 30 via two series connected inverters 13, 14. Each of the P-channel MOS transistors T3, T4 has a gate which receives an inversion of the switch enable signal EN via the inverter 13.

The precharge drive circuit 15 comprises three P-channel MOS transistors T5, T6 and T7 and is connected between the data bus GDBX and the data bus GDBZ. Each of the transistors T5 to T7 has a gate which receives a precharge signal PR via two series connected inverters 16, 17. The precharge drive circuit 15 precharges the data buses GDBX, GDBZ in response to the precharge signal PR.

When the switch enable signal EN assumes its H level, the first and second transfer gate circuits 11, 12 are both turned on, providing connections between the data buses GDBX, GDBZ and the intermediate data buses MGDBX, MGDBZ. In contrast, when the switch enable signal EN assumes its L level, the first and second transfer gate circuits 11, 12 are both turned off, interrupting the connection between the data buses GDBX, GDBZ and the intermediate data buses MGDBX, MGDBZ. More specifically, the first transfer gate circuit 11 selectively connects between the data bus GDBX and the intermediate data bus MGDBX, and similarly the second transfer gate 12 selectively connects between the data bus GDBZ and the intermediate data bus MGDBZ.

Figure 5:
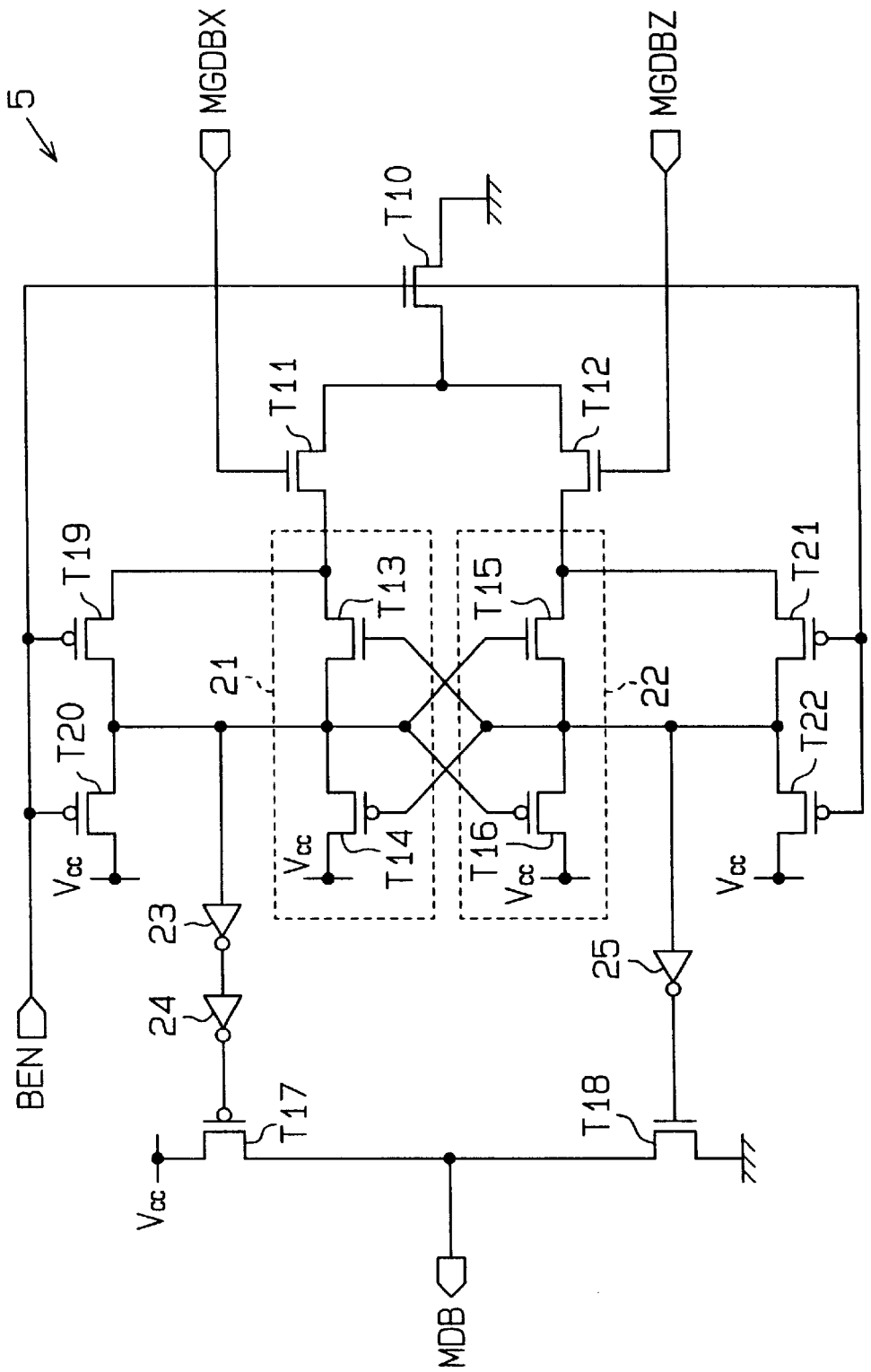
FIG. 5 is a circuit diagram of a data buffer of the DRAM of FIG. 3.

Referring now to FIG. 5, the data buffer 5 will be described. The data buffer 5 is a differential amplifier circuit in which its elements are preferably disposed in a symmetrical manner, thus permitting high accuracy differential amplification.

The data buffer 5 comprises a pair of first and second N-channel MOS transistors T11, T12 which form an amplifier. Each of the first and second NMOS transistors T11, T12 has a gate connected to the intermediate data bus MGDBX or MGDBZ, respectively. The sources of the first and second NMOS transistors T11, T12 are connected together and to the ground via a current controlling N-channel MOS transistor T10. The first and second NMOS transistors T11, T12 also have drains which are connected to first and second CMOS inverter circuits 21, 22, respectively. The NMOS transistor T10 has a gate which receives a buffer enable signal BEN.

The first and second CMOS inverter circuits 21, 22 together form a latch circuit. The first CMOS inverter circuit 21 comprises an N-channel MOS transistor T13 and a P-channel MOS transistor T14, which have their gates or input terminals connected together and their drains (output terminals) also connected together. The NMOS transistor T13 has a source connected to the drain of the first NMOS transistor T11 and the PMOS transistor T14 has a source connected to a power supply Vcc.

The second CMOS inverter circuit 22 comprises an N-channel MOS transistor T15 and a P-channel MOS transistor T16, which have their gates (input terminals) connected together and their drains (output terminals) also connected together. The drains of the transistors T15, T16 are connected to the gates of the transistors T13, T14 and the gates of the transistors T15, T16 are connected to the drains of the transistors T13, T14. The NMOS transistor T15 has a source connected to the drain of the second NMOS transistor T12 and the PMOS transistor T16 has a source connected to the power supply Vcc.

The first CMOS inverter circuit 21 has an output terminal which is connected via series connected inverters 23, 24 to the gate of a P-channel MOS transistor T17. The second CMOS inverter circuit 22 has an output terminal which is connected via an inverter 25 to an N-channel MOS transistor T18. The PMOS transistor T17 and the NMOS transistor T18 form an output section. Each of the MOS transistors T17, T18 has a drain (output terminal) which is connected to the main data bus MDB. The PMOS transistor T17 has a source connected to the power supply Vcc and the NMOS transistor T18 has a source connected to the ground.

Accordingly, when the output terminal of the first CMOS inverter circuit 21 assumes its H level and the output terminal of the second CMOS inverter circuit 22 assumes its L level, the PMOS transistor T17 is turned off and the NMOS transistor T18 is turned on. Consequently, an L level data signal is delivered to the main data bus MDB. In contrast, when the output terminal of the first CMOS inverter circuit 21 assumes its L level and the output terminal of the second CMOS inverter circuit 22 assumes its H level, the PMOS transistor T17 is turned on and the NMOS transistor T18 is turned off. As a consequence, an H level data signal is delivered to the main data bus MDB.

The first NMOS transistor T11 has a drain which is connected to the power supply Vcc via P-channel MOS transistors T19, T20, which form a driver. The second NMOS transistor T12 has a drain which is connected to the power supply Vcc via P-channel MOS transistors T21, T22, which form a second driver. A node between the PMOS transistors T19, T20 is connected to the output terminal of the first CMOS inverter circuit 21. A node between the PMOS transistors T21, T22 is connected to the output terminal of the second CMOS inverter circuit 22. The gates of the PMOS transistors T19–T22 are together and connected to the gate of the NMOS transistor T10 and receive the buffer enable signal BEN.

When the buffer enable signal BEN assumes its L level, the PMOS transistors T19–T22 are turned on and the NMOS transistor T10 is turned off. In response thereto, the data buffer 5 has no driving function. This is because turning off the NMOS transistor T10 also turning off the first and second NMOS transistors T11, T12, which functions to provide an amplification. Because the PMOS transistors T19–T22 are turned on at this time, an H level is established at both of the output terminals of the first and second CMOS inverter circuits 21, 22. Consequently, the MOS transistors T17, T18 in the output section are both turned off, assuming a high impedance condition.

On the other hand, when the buffer enable signal BEN assumes its H level, the PMOS transistors T19–T22 are turned off and the NMOS transistor T10 is turned on. This allows the data buffer 5 to exercise its driving function. For example, when an L level data signal is delivered to the intermediate data bus MGDBX and an H level data signal is delivered to the intermediate data bus MGDBZ, the output terminal of the second CMOS inverter circuit 22 falls to its L level and the output terminal of the first CMOS inverter circuit 21 is maintained at its H level. As a consequence, the PMOS transistor T17 is turned off and the NMOS transistor T18 is turned on, whereby an L level data signal is delivered to the main data bus MDB. In contrast, when an H level data signal is delivered to the intermediate data bus MGDBX and an L level data signal is delivered to the intermediate data bus MGDBZ, an H level data signal is delivered to the main data bus MDB.

Referring back to FIG. 3, the operation of the DRAM 200, in particular, the switching action of the transfer switch 6 will now be described. The transfer switches 6 in the first cell array bank A1 receive the identical switch enable signal EN (FIG. 4), and thus are collectively turned on or off. Similarly, the transfer switches 6 in the second cell array bank A2 receive the identical switch enable signal EN, and thus are collectively turned on or off. However, the switch enable signal EN is controlled such that the transfer switches 6 in the first cell array bank A1 and the transfer switches 6 in the second cell array bank A2 cannot be turned on simultaneously. Specifically, when the transfer switches 6 in the first cell array bank A1 receive the switch enable signal EN-high, the transfer switches 6 in the second cell array bank A2 receive the switch enable signal EN-low. For example, when one of the cell arrays 2 in the first cell array bank A1 is activated, the switch enable signal EN-high is applied to the transfer switches 6 in the first cell array bank A1. At this time, the switch enable signal EN-low is applied to the transfer switches 6 in the second cell array bank A2 which is deactivated.

When the transfer switches 6 in the cell array bank A1 or A2 which is activated are turned on, the data bus GDB in the cell array bank A1 or A2 is connected to the associated data buffer 5 via the intermediate data bus MGDB. At this time, the data bus GDB of the cell array bank A1 or A2 which is deactivated is not connected to the intermediate data bus MGDB (or data buffer 5) which both of the banks A1, A2 share. This is because the pair of transfer switches 6 share the single data buffer 5. Accordingly, when any one of the cell arrays 2 in the first and second cell array banks A1, A2 is activated, data from that cell array 2 is fed to the main data bus MDB via the data buffer 5.

As described above, by allowing the pair of transfer switches 6 to share a single data buffer 5, the number of data buffers 5 can be reduced to one-half the number of the transfer switches 6, thereby enabling the breadth of the data buffer chosen equal to twice the layout pitch P. In this manner, if the data buffer 5 contains an increased number of elements, the symmetry of elements within the data buffer can be secured in a reliable manner.

When the memory capacity of the DRAM 200 increases, and it is constructed in a higher density, it follows that the layout pitch P will be reduced. Even in such instance, a breadth of the data buffer 5 which is twice the layout pitch P is secured, thereby allowing the data buffers 5 positively formed without undue restrictions.

It should be apparent to those skilled in the art that the present invention may be embodied in many other specific forms without departing from the spirit or scope of the invention. Particularly, it should be understood that the invention may be embodied in the following forms:

One data buffer 5 may be shared by more than two (or n) cell array banks. In this instance, it is possible to achieve a breadth of the data buffer 5 which is n times the layout pitch P.

The circuit arrangement of the data buffer 5 and the transfer switch 6 may be suitably changed.

Instead of or in addition to the DRAM 200, the present invention may be applied to any other semiconductor memory such as a ROM, a static RAM or the like.

Therefore, the present examples and embodiments are to be considered as illustrative and not restrictive and the invention is not to be limited to the details given herein, but may be modified within the scope and equivalence of the appended claims.

What is claimed is:

1. A semiconductor memory comprising:
    a plurality of cell arrays each including a plurality of memory cells;
    a plurality of data buses connected to the memory cells disposed in an area of the plurality of cell arrays;
    a plurality of transfer switches connected to the plurality of data buses; and
    a plurality of data buffers connected in common to the plurality of transfer switches,
    wherein the plurality of transfer switches are controlled so that when a specific one of the cell arrays is activated, the plurality of data buses in the specific one of the cell arrays are connected with the plurality of data buffers.

2. The semiconductor memory according to claim 1, wherein the plurality of transfer switches are connected with the plurality of data buffers in the same sequential order.

3. The semiconductor memory according to claim 2, wherein each cell array includes a plurality of sense-amps connected to the plurality of data buses, each data bus being connected with two of the sense-amps.

4. The semiconductor memory according to claim 1, wherein the plurality of memory cells form a plurality of cell array banks, the transfer switches are disposed according to a layout pitch defined by a spacing between adjacent data buses, and the data buffers are disposed according to a pitch which is derived by multiplying the layout pitch by the number of the cell array banks.

5. The semiconductor memory according to claim 4, wherein the number of the cell array banks is equal to two, and the data buffers are disposed at a pitch which is twice the layout pitch.

6. The semiconductor memory according to claim 4, wherein each data buffer comprises a differential amplifier.

7. The semiconductor memory according to claim 6, wherein each data buffer includes a plurality of elements disposed in a substantially symmetrical manner.

8. The semiconductor memory according to claim 1, further comprising a plurality of intermediate data buses which connect the plurality of transfer switches with the plurality of data buffers.

9. The semiconductor memory according to claim 8, wherein one data buffer and one transfer switch are connected to a single intermediate data bus.

10. The semiconductor memory according to claim 8, further comprising a plurality of main data buses which are connected with the plurality of data buffers, respectively.

11. The semiconductor memory according to claim 1, wherein the number of transfer switches is equal to the number of data buffers.

12. A method of controlling a semiconductor memory including a plurality of cell arrays each including a plurality of memory cells, a plurality of data buses connected to the memory cells disposed in an area of the plurality of cell arrays, a plurality of transfer switches connected to the plurality of data buses, and a plurality of data buffers connected in common to the plurality of transfer switches, the method comprising the steps of:

activating a specific one of the cell arrays;

deactivating the remaining cell arrays;

turning on the transfer switches associated with the activated the cell array to connect the plurality of data buses with the plurality of data buffers; and turning off the plurality of transfer switches which correspond to the remaining cell arrays to disconnect the plurality of data buses from the plurality of data buffers.

13. A semiconductor memory, comprising:

a plurality of cell arrays, each including a plurality of memory cells;

a plurality of sense amplifier rows extending in a first direction in an area of the plurality of cell arrays, each of the sense amplifier rows including a plurality of sense amplifiers;

a plurality of transfer switch rows extending in the first direction adjacent to each of the cell arrays, each of the plurality of transfer switch rows including a plurality of transfer switches;

a plurality of first data bus lines connecting the sense amplifiers with the transfer switches, wherein the first data bus lines extend in a second direction which is substantially perpendicular to the first direction, each data bus line connecting one sense amplifier in each sense amplifier row to one of the transfer switches;

a plurality of data buffer rows extending in the first direction, each data buffer row including a plurality of data buffers; and a plurality of second data bus lines extending in the first direction and connecting the plurality of transfer switches with the data buffers.

14. The memory of claim 13, wherein the plurality of cell arrays form a plurality of cell array banks, each data buffer is connected to more than one transfer switch, wherein each of the connected transfer switches is associated with a different one of the plurality of cell array banks.

15. The memory of claim 13, wherein a layout pitch is defined by a spacing between adjacent first data bus lines and wherein the transfer switches are placed in accordance with the defined layout pitch and the data buffers are placed according to a layout pitch determined by multiplying the defined layout pitch by the number of cell array banks.

16. The memory of claim 13, wherein each data buffer comprises a differential amplifier.

17. The memory of claim 13, wherein each transfer switch includes first and second transfer gate circuits and a precharge drive circuit connected between an input terminal of each of the first and second transfer gate circuits.

18. The memory of claim 13, further comprising a plurality of third data bus lines extending in the first direction and connected to the data buffers.

19. A semiconductor memory comprising:

a first and a second memory block, each including memory cells;

a first group of data buses for transmitting a data from the memory cells in the first memory block;

a second group of data buses for transmitting a data from the memory cells in the second memory block;

a first group of transfer switches, each connected to corresponding one of the first group of data buses;

a second group of transfer switches, each connected to corresponding one of the second group of data buses;

a plurality of data buffers, each coupled to both of corresponding one of the first group of transfer switches and one of the second group of transfer switches;

wherein the first and second groups of transfer switches, which receive a control signal, are controlled such that when one of the first and second groups of transfer switches turns on, another of the first and second groups of transfer switches turns off, in response to the control signal.

20. The semiconductor memory according to claim 19, wherein the first group of data buses is disposed on the first memory block and the second group of data buses is disposed on the second memory block, and the plurality of data buffers are disposed along one end of the first and second memory block.

* * * * *